(12) United States Patent
Schaule et al.

(10) Patent No.: US 7,741,861 B2
(45) Date of Patent: Jun. 22, 2010

(54) TEST APPARATUS FOR THE TESTING OF ELECTRONIC COMPONENTS

(75) Inventors: Maximilian Schaule, Mindelheim (DE); Manuel Petermann, Rosenheim (DE); Stefan Kurz, Rosenheim (DE); Andeas Nagy, München (DE)

(73) Assignee: Multitest elektronische Systeme GmbH, Rosenheim (DE)

( * ) Notice: Subject to any disclaimer, the term of this patent is extended or adjusted under 35 U.S.C. 154(b) by 135 days.

(21) Appl. No.: 12/090,419

(22) PCT Filed: Mar. 29, 2007

(86) PCT No.: PCT/EP2007/002823

§ 371 (c)(1),
(2), (4) Date: Apr. 30, 2008

(87) PCT Pub. No.: WO2007/115698

PCT Pub. Date: Oct. 18, 2007

(65) Prior Publication Data
US 2008/0231296 A1    Sep. 25, 2008

(30) Foreign Application Priority Data
Apr. 3, 2006    (DE) .................... 10 2006 015 363

(51) Int. Cl.
*G01R 31/02* (2006.01)
(52) U.S. Cl. ..................................... 324/758
(58) Field of Classification Search .............. 324/158.1, 324/754–762
See application file for complete search history.

(56) References Cited

U.S. PATENT DOCUMENTS

| | | | |
|---|---|---|---|
| 5,743,324 A * | 4/1998 | Kunstreich et al. | 164/504 |
| 6,246,246 B1 * | 6/2001 | Hembree | 324/754 |
| 6,404,212 B1 | 6/2002 | Mehta et al. | |
| 6,580,283 B1 * | 6/2003 | Carbone et al. | 324/760 |
| 6,897,645 B2 * | 5/2005 | bin Mohamed Hassan | 324/158.1 |
| 7,235,949 B2 * | 6/2007 | Ikeda | 320/132 |
| 2002/0071127 A1 | 6/2002 | Takano et al. | |
| 2005/0162150 A1 * | 7/2005 | Nakamura | 324/158.1 |
| 2005/0280427 A1 * | 12/2005 | Lou et al. | 324/754 |
| 2006/0066340 A1 | 3/2006 | Sasaki | |
| 2007/0152654 A1 * | 7/2007 | Tsai | 324/158.1 |
| 2008/0284455 A1 * | 11/2008 | Obikane et al. | 324/754 |

OTHER PUBLICATIONS

International Search Report for PCT/EP2007/002823 dated Aug. 3, 2007.

* cited by examiner

*Primary Examiner*—Ha Tran T Nguyen
*Assistant Examiner*—Joshua Benitez
(74) *Attorney, Agent, or Firm*—Nixon & Vanderhye PC (57) ABSTRACT

In the case of a test apparatus for testing electronic components which are present in an assembly, in particular in the form of strips, a slide-like contacting board supporting device, to which the contacting board can be fastened, is mounted on the test head. The contacting board supporting device can be moved parallel to the plane of the contacting board when the contacting nest is docked on the test head, with the result that the contacting board can be brought into different test positions which are laterally beside one another.

7 Claims, 6 Drawing Sheets

TEST APPARATUS FOR THE TESTING OF ELECTRONIC COMPONENTS

This application is the U.S. national phase of International Application No. PCT/EP2007/002823 filed 29 Mar. 2007 which designated the U.S. and claims priority to German Application No. 10 2006015 363.4 filed 3 Apr. 2006, the entire contents of each of which are hereby incorporated by reference.

The invention relates to a test apparatus for the testing of electronic components, in particular semiconductor modules, which are present in an assembly, in particular in the form of strips.

As is known, semiconductors are subjected to a function test before being fitted on printed circuit boards, etc., wherein this frequently takes place under specific temperature conditions. For example, the components can be tested in a temperature range from −60° C. to +170° C. Handling devices exist for this purpose, also referred to as handlers, which convey the components to a contacting nest arranged inside the handler. The contacting nest with the components is then docked to a test head, which creates the electrical connection to an electronic arithmetic unit. In this situation, the principle is known of the components being tested not only individually but also in an assembly, in particular in the form of strips (such as lead frames). This is advantageous in particular if very small components are involved, which as individual elements would only be capable of being handled with great difficulty. In addition, several components can be tested per time unit if they are arranged in an assembly on a strip, which can also reduce test costs.

If a very large number of small components are located on a strip, which can frequently be only a few millimeters or smaller in size, then as a rule it is no longer possible for the contacting board (DUT board or "Device Under Test Board") of the test head to be formed with a sufficiently large number of contact pins or contact springs that all the components of a strip can be brought into contact and tested simultaneously. One of the reasons lies in the fact, for example, that for each contact pin or each contact spring an independent lead must be provided to the evaluation and arithmetic unit arranged behind it, which with a very large number of contact pins or springs would create problems.

In order to be able, nevertheless, to test economically strips with a large number of small components lying close to one another, the principle is known, for example from US 2005/0 162 150 A1, of establishing the contact initially only for a sub-group of components of a strip, and then, after the function test has been performed, of moving the contacting nest sideways relative to the test head, in order then to bring another sub-group of the same strip into contact. This, however, requires elaborate adjustment mechanisms for the contacting nest inside the handler. The complexity of such adjustment mechanisms is particularly high with contacting nests in particular, which for performing temperature tests must be temperature-controlled to quite specific and frequently extreme temperatures. Furthermore, such a test method cannot be used with strips which are not conducted to the test head automatically by means of a handler but manually.

From U.S. Pat. No. 6,404,212 B1 a test apparatus is known according to the preamble to claim 1. This makes reference in general only to a contacting board with a three-dimensional room for movement, without more details being given of how this is achieved.

The invention is based on the object of providing a test apparatus of the type referred to in the preamble, which has a particularly high degree of reliability and precision during the testing of components present next to one another in an assembly.

This object is resolved according to the invention by a test apparatus with the features of claim 1. Advantageous embodiments of the invention are described in the further claims.

With the test apparatus according to the invention, a contacting board supporting device in the form of a slide is held at the test head, to which the contacting board can be secured, in which the contacting board supporting device can be moved, when the contacting nest is docked to the test head, parallel to the plane of the contacting board, so that the contacting board can be brought into different test positions located laterally next to one another.

With the test apparatus according to the invention, therefore, the change of position for establishing contact of the contact surfaces of the components of a strip is carried out by changing the position of the contacting board relative to the strip, while the contacting nest retains its docking position at the test head unchanged once it has assumed this. Due to the fact that the entire adjustment mechanism for the lateral movement of the contacting board is arranged at the test head, the module in which the contacting nest is handled inside the handler can be designed substantially more simply in comparison with such test apparatus in which the contacting nest is moved during the test procedure. In addition, the contacting board is stabilized by the contacting board supporting device. Bending of the contacting board can be reliably prevented.

A particular advantage of the test apparatus according to the invention lies in the fact that the principle of the contacting board being movable sideways can also be put to use with test apparatus which serve to test and calibrate micro-electronic components (such as MEMS), which during the function test must be brought into a specific inclination angle in relation to the perpendicular. In addition to static function tests, it is possible in this situation to carry out dynamic tests also, wherein the components can be dynamically pivoted about one or two axes lying perpendicular to one another. In this situation, the contacting nest secured to the test head is inclined or pivoted in the corresponding manner, wherein it was not possible previously to test a strip in a rapid manner by changing the relative position between components and contacting board. In addition, the apparatus according to the invention can also be used with test modules which are not fitted automatically by means of a handler, but manually, and are placed, for example, on a table.

According to an advantageous embodiment, the contacting board can be moved perpendicular to the plane of the contacting board, so that the contacting nest can be moved to the components and away from them when the contacting nest is docked to the test head. The contacting board therefore carries out a lifting movement relative to the test head, this being necessary in order to prevent the contact pins or springs grinding along on the components while the contacting board is moved sideways into the next test position. As an alternative to this, however, it is also possible for an apparatus to be provided, with which it is not the contacting board but the contacting nest which is raised slightly from the test head and, after the contacting board has carried out the sideways movement, it is again pushed tight against the test head.

According to an advantageous embodiment, the test head has a test head bracket with at least one guide rail. In addition, the contacting board supporting device has a rail engagement part guided so as to move on at least one guide rail of the test head bracket and a contacting board supporting part which is held on the rail engagement part so as to move relative to the rail engagement part and perpendicular to the plane of the contacting board, wherein a lifting mechanism is provided, with which the contacting board supporting part together with the contacting board, when the contacting nest is docked, can be removed from the components and can be brought close to them. The lifting mechanism in this situation preferably comprises levers with rams, which can be moved in the lifting direction by means of a pivot movement of the levers in order to move the contacting board supporting part in the contacting direction. In addition, advantageously a withdrawal device in the form of springs takes effect between the rail engagement part and the contacting board supporting part, in order to move the contacting board supporting part against the contacting device into a withdrawn position. With such an arrangement, the required lifting movement of the contacting board relative to the components can be effected in a rapid, reliable and relatively easy manner.

The invention is described hereinafter in greater detail on the basis of the drawings. These show.

Figures 1, 2:
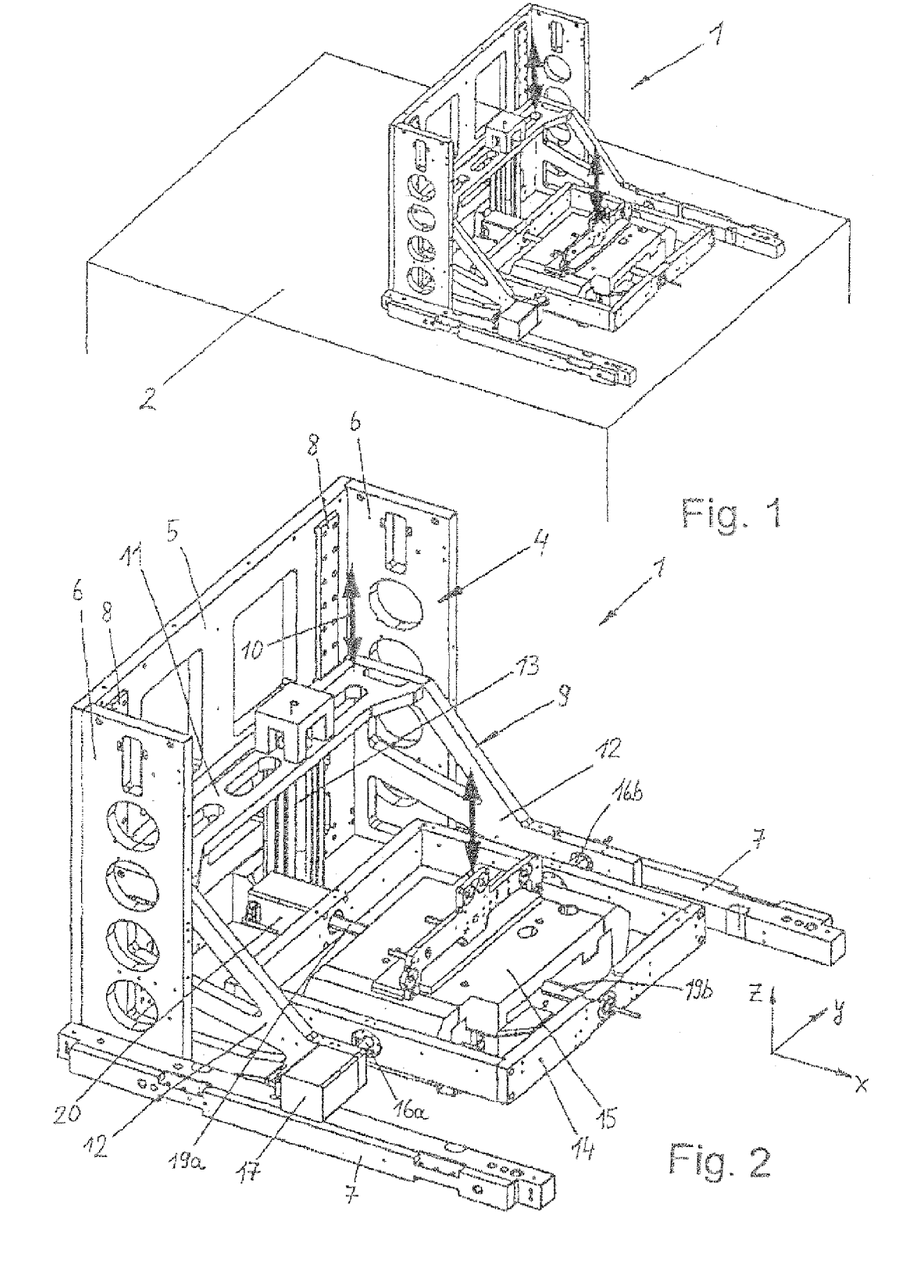
FIG. 1: A test apparatus according to the invention arranged on a handler or table, represented only in diagrammatic form.
FIG. 2: The test apparatus from FIG. 1 in a position alone.

FIG. 1 shows a test apparatus which can be secured or located on the upper side of a handler 2, represented only diagrammatically, i.e. of an automatic handling device for electronic components, or on another flat surface, such as a table. The test apparatus serves to test electronic components, not illustrated in detail, in the form of semiconductors which are present in an assembly, in particular in the form of strips, and which are intended to undergo a function test before their assembly on printed circuit boards etc., in particular under special heat conditions.

The test apparatus is described in greater detail hereinafter on the basis of FIG. 2.

The test apparatus 1 has an outer frame 4, which comprises a vertical plate 5 on the rear, two vertical side plates 6 and two lower horizontally arranged bracket profile elements 7.

In the side areas the vertical plate 5 has two guide rails 8 arranged vertically and parallel to one another, along which a slide 9 can be displaceably guided. The slide 9 can therefore be raised and lowered in the vertical direction, as indicated by the arrow 10. The slide 9 is designed as a portal and has a horizontal transverse yoke 11 which rests on the guide rails 8 and engages behind these in an appropriate manner. Rigidly secured to both ends of the transverse yoke 11 are side elements 12, which extend from the transverse yoke 11 vertically upwards and forwards beyond it.

For vertical movement of the slide 9, a lifting mechanism 13 is provided, in the form of a lifting cylinder 13, operating advantageously by pneumatic means, which engages on one side at the transverse yoke 11 and on the other side at the vertical plate 5. The lifting cylinder 13 moving outwards causes the slide 9 to be raised and, by retracting the cylinder 13, it is lowered into the position shown in FIG. 2.

The slide 9 serves to retain in a pivotable manner a pivot frame 14, which in turn carries a test head 15 in a pivotable manner. The pivot frame 14 is mounted by means of pivot axis elements 16a, 16b, arranged in alignment with one another, in the side elements 12 of the slide 9. The pivoting of the pivot frame 14 is effected by means of a pivot drive 17 which takes effect on the pivot axis element 16a.

In addition, the test head 15 can also be pivoted about the X-axis relative to the pivot frame 14. To do this, pivot axis elements 19a, 19b project in alignment with one another from the opposite sides of the test head 15, these being rotatably mounted in the pivot frame 14. The pivoting of the test head 15 relative to the pivot frame 14 is effected by means of a pivot drive 20, which is secured to the pivot frame 14 and takes effect on the pivot axis element 19a of the test head 15.

The test head 15 is therefore suspended in Cardan fashion at the slide 9 and can pivot about two pivot axes located perpendicular to one another, so that the test head 15 can either statically adopt a predetermined inclination to the perpendicular or can be pivoted dynamically about one or two axes.

Figure 4:
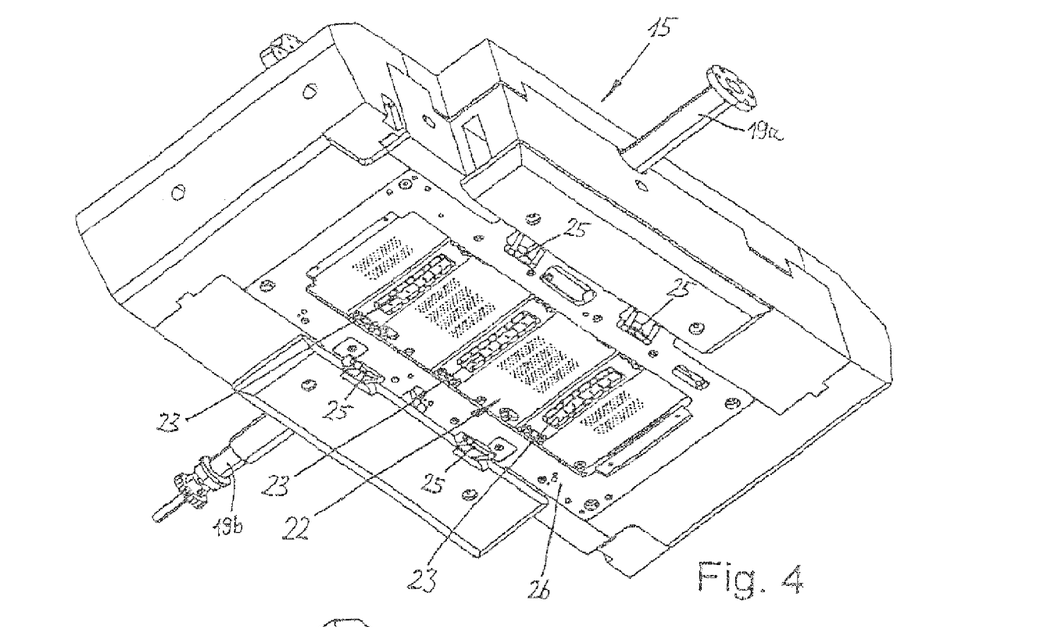
FIG. 4: A test head in a position alone obliquely from above, wherein the contacting board is represented in a first position.
Figure 5:
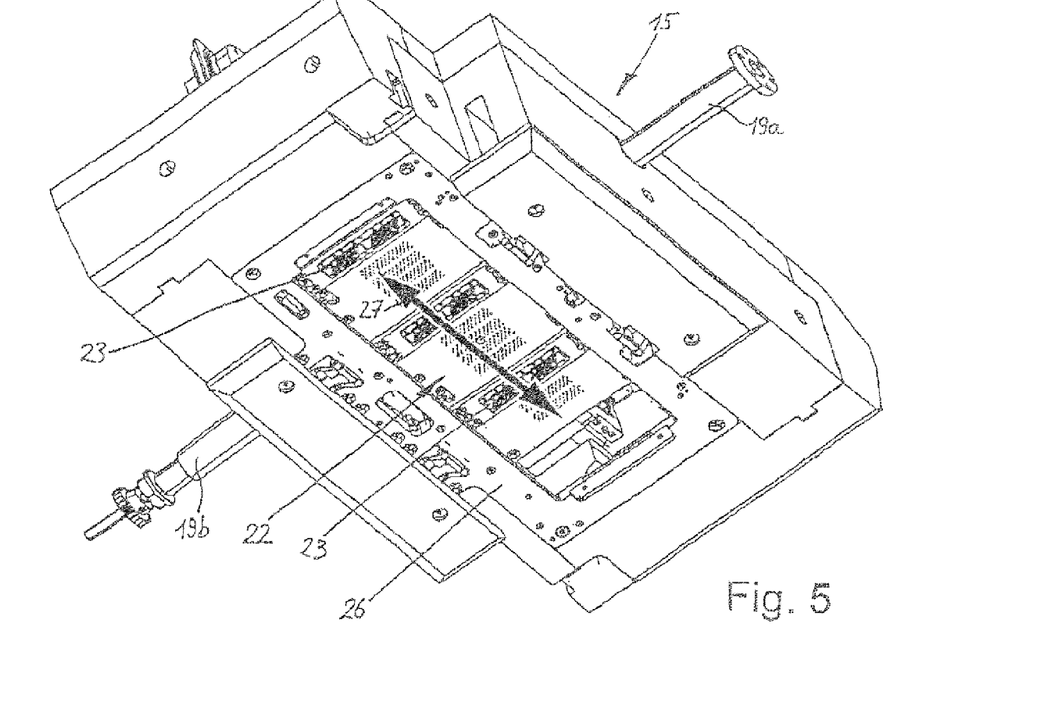
FIG. 5: A representation corresponding to FIG. 4, wherein the contacting board is represented in a second position.

As can be seen from FIGS. 4 and 5, the test head 15 has on its underside a contacting board 22 (DUT board) with three contact sockets 23. Provided at the contact sockets 23 in each case are a plurality of contact pins, which are accessible from below. The contact pins are in this situation arranged in such a way that they can be placed onto corresponding connection contacts of components which are present in an assembly, in particular in the form of strips, so that an electrical connection can be established between the components and an electronic test device.

Figure 10:
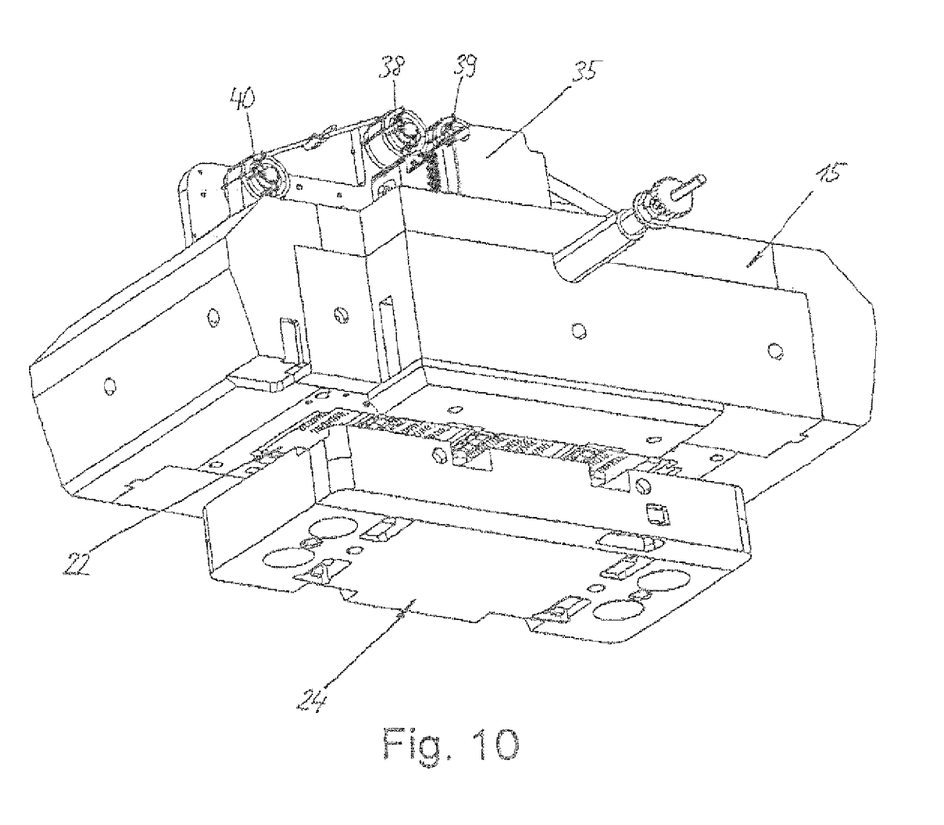

For testing a strip, it is firstly placed from above into a contacting nest 24, which can be seen from FIG. 10. This can be done either inside a handler automatically by means of appropriate conveying devices (pick-and-place unit) or even manually. If it is intended that the function test of the components should take place at specific temperatures, the strips are brought to the appropriate temperature beforehand and, advantageously, are further adjusted in temperature both when being conveyed into the contacting nest and when in the contacting nest 24 itself. The contacting nest 24 is then raised, for example by means of a lifting device, not shown, of a handler and docked to the underside of the test head 15, so that the contact pins of the contacting board 22 are placed onto the corresponding connection contacts of the components which are to be tested. FIG. 10 shows the contacting nest 24 shortly before docking to the test head 15.

During testing of the components the contacting nest 24 is held securely by means of retaining devices 25 (FIGS. 4, 5) to the underside of the test head 15, wherein the contacting board 22 is in contact with a stationary docking plate 26 of the test head 15 on the base side.

As can be derived from a comparison of FIGS. 4 and 5 and as is made clear by the arrow 27 in FIG. 5, the contacting board 22 is arranged so as to be displaceable at the test head 15. The displacement takes place in this situation in the plane of the contacting board and advantageously in the longitudinal direction of the test head 15. As an alternative to this, however, it is also possible for the contacting board 22 to be displaced in the transverse direction of the test head 15. Displacement of the contacting board 22 is carried out in order to change the position of the contact pins, which are arranged in the embodiment shown in three contact sockets 23 separated from one another on the contacting board 22, relative to the allocated connection contacts of the components, which are located inside the contacting nest 24 in a non-displaceable manner. By changing the position of the contacting board 22, it is therefore possible for several groups of components of a strip located next to one another to be tested without the contacting nest 24 being removed from the test head 15 and the contacting nest or strip respectively having to be realigned.

Figure 6:
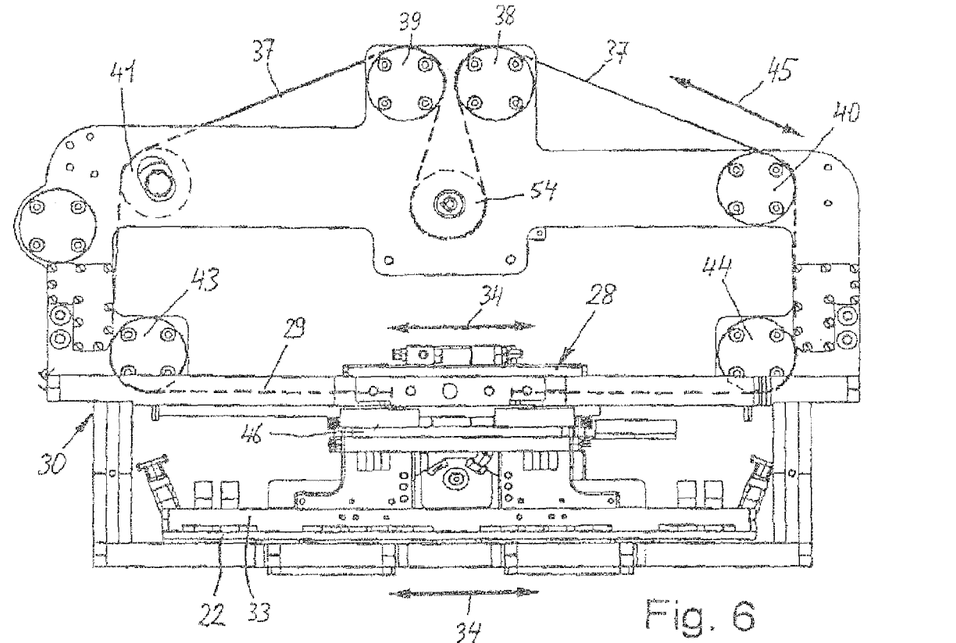
FIG. 6: A longitudinal section through the test head from FIGS. 3 and 4, represented partially diagrammatically (direction of view from behind, in which the contacting board is represented in a middle position, FIG. 7: A representation according to FIG. 6, wherein the contacting board is represented in a position moved to the right, FIG. 8: A side view of substantial parts of a contacting board supporting device to illustrate the lifting mechanism, FIG. 9: A representation of the contacting board supporting device from FIG. 8 in another lifting position, and FIG. 10: The test head from FIG. 10 obliquely from below, with a contacting nest shortly before the docking position.
Figure 7:
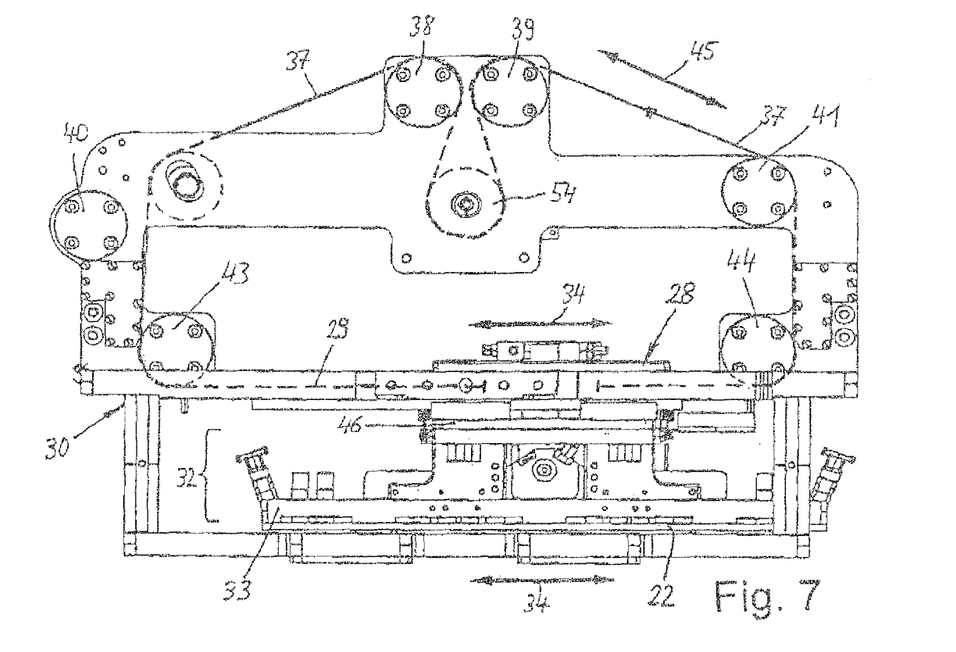

In order to be able to move the contacting board 22 sideways relative to the rest of the test head 15, the test head 15 has a contacting board supporting device 28, as can be seen from FIGS. 6 and 7, which is designed in the form of a slide and is guided on at least one guide rail 29 of a test head bracket 30 in longitudinal movement. The guide rail 29 in this situation runs parallel to the contacting board 22.

The contacting board supporting device 28 furthermore consists of an upper rail engagement part 31 and a lower contacting board supporting part 32. Secured to the lower end of the contacting board supporting part 32 is a bracing plate 33, which at least essentially has the same external dimensions as the contacting board 22 and prevents any flexure of the contacting board 22. The contacting board 22 is in turn secured to the underside of the bracing plate 33.

Figure 3:
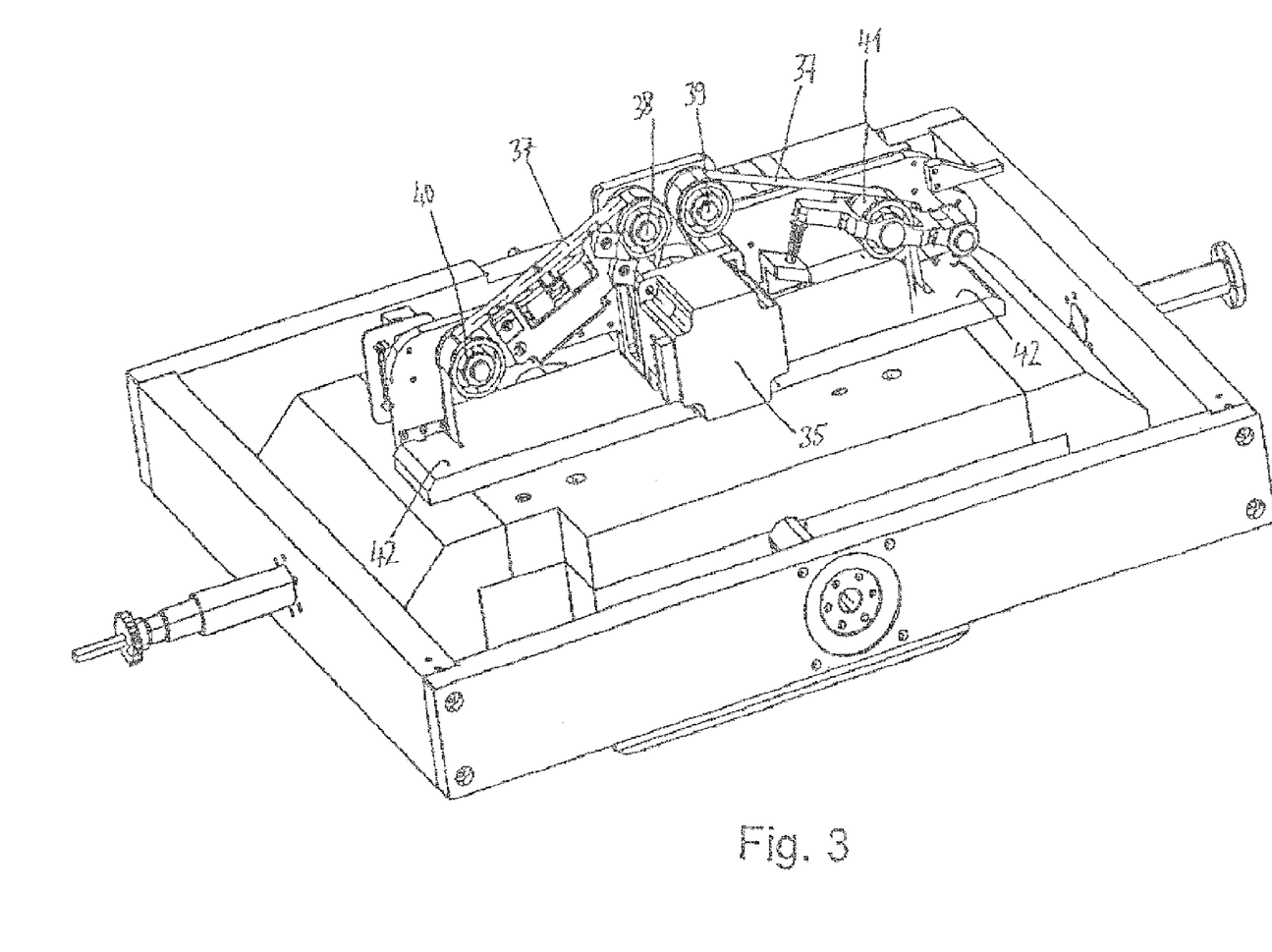
FIG. 3: A test head with pivot frame obliquely from above in a position alone.

In order to move the contacting board supporting device 28 in the direction of the arrows 34 (FIGS. 6 and 7), a slide drive 35, which can be seen from FIG. 3, is arranged on the upper side of the test head 15. The slide drive 35 can, for example, take the form of an electric motor, in particular a stepping motor. Located on the output shaft of the slide drive 35 is a drive roller 54, covered in FIG. 3 by the slide drive 35, which drives a drawing band 37. The drawing band 37 is guided via deflection rollers 38, 39, 40, 41 mounted on the upper side of the test head 15 in the direction of the mutually opposed end areas of the test head 15 and there runs through apertures in an upper cover plate 42, which can also for example involve an insulating layer, into the interior of the test head 15. By means of further deflection rollers 43, 44, the drawing band 37 runs to the contacting board supporting device 28, where it is secured at both its ends to the mutually opposed sides of the rail engagement part 31. If the drawing band 37 moves as a result of the slide drive 35 in the direction of the arrow 45 (FIGS. 6, 7), the entire contacting board supporting device 28 moves with the contacting board 22 in the direction of the arrows 34. Depending on the direction of rotation of the slide drive 35, this makes it possible for the contacting board 22 to be displaced to the left or right relative to the remaining test head 15.

So that the contact pins do not grind on the components during a sideways movement of the contacting board 22, the contacting board 22 must additionally carry out a lifting movement, i.e. a movement perpendicular to the plane of the contacting board, so that the contact pins are raised from the connection contacts of the components after the function test has been carried out, before the contacting board 22 is moved sideways and the contact pins are again placed onto the connection contacts of other components of the same strip. To do this, the contacting board supporting part 32 is mounted on the rail engagement part 31 in a height adjustable manner, as can be seen from FIGS. 8 and 9. For the sake of overview, the contacting board supporting device 28 is illustrated there without the bracing plate 33.

Figure 8:
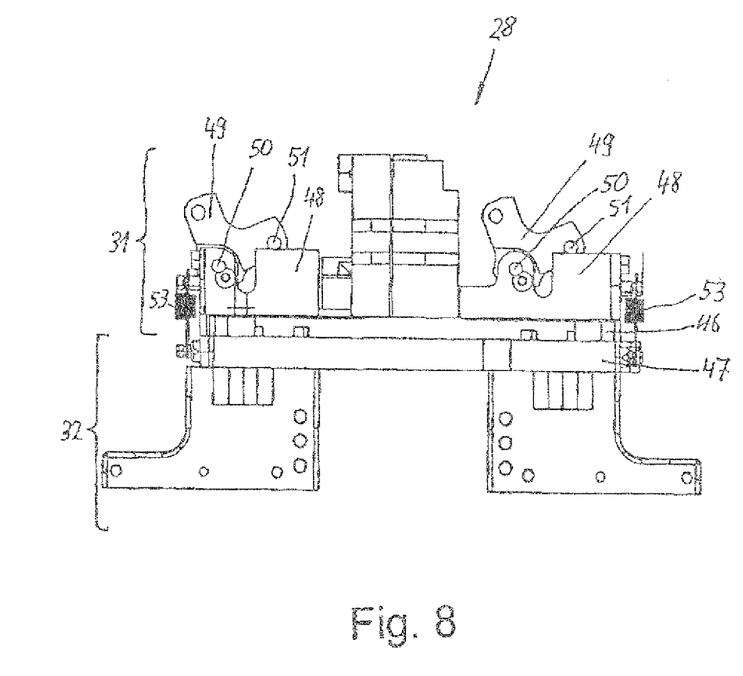
Figure 9:
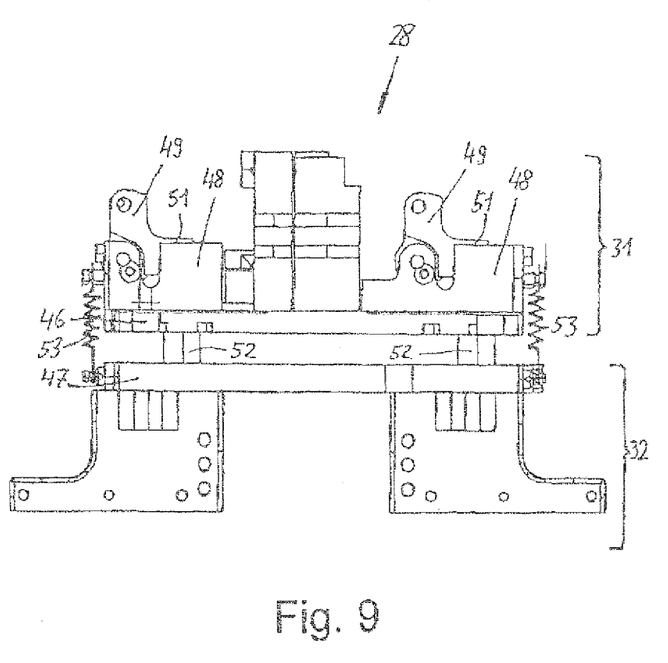

As can be seen, the rail engagement part 31 has a floor side base plate 46, with which, as can be seen from FIG. 8, a coupling plate 47 is in contact, forming the upper termination of the contacting board supporting part 32. Secured on the base plate 46 are brackets 48 which allow for levers 49 to be held in a pivotable manner, which in the present case are designed as L-shaped knee joints. The levers 49 can be pivoted about pivot axes 50. By means of a lever arm 51 of the lever 49, vertically arranged rams 52 (FIG. 9) can be moved vertically when the levers 49 are pivoted about the pivot axes 50. The rams 52 are guided in a displaceable manner longitudinally inside the base plate 46 and impact with their lower end onto the coupling plate 47 or are secured to this. If the levers 49 are pivoted from the position shown in FIG. 8 in the clockwise direction into the position shown in FIG. 9, then the rams 52 project downwards over the base plate 46 and press the coupling plate 47, and therefore the entire contacting board supporting unit 32, downwards as shown in FIG. 9. The contacting board 22 secured to the contacting board supporting unit 32 is therefore likewise moved downwards, so that the contact pins can be placed onto the connection contacts of the components.

If it is intended that the contacting board 22 should be raised again from the connection contacts in order to move the contacting board 22 sideways, the levers 49 are moved counter-clockwise into the position represented in FIG. 8, so that the pressure on the rams 52 is lifted. The contacting board supporting part 32 can then be withdrawn by means of springs 53, which are secured on one side to the brackets 48 and on the other side to the coupling plate 47, into the position shown in FIG. 8, until the coupling plate 47 comes into contact with the base plate 46 again.

The drive for pivoting the levers 49 is not represented in any greater detail. In this connection, this may involve pneumatic cylinders, for example.

The invention claimed is:

1. A method for testing electronic components comprising:
inserting components to be tested into a contacting nest,
docking the contacting nest to a test head having a contacting board supporting device in the form of a slide, which can be moved on at least one guide rail of the test head, and a contacting board with a plurality of contacting elements in the form of contacting pins or contacting springs, in which the contacting board supporting device has a rail engagement part held on the guide rail and a contacting board supporting unit capable of being moved perpendicular to the rail engagement part,
to perform a first test, contacting the contacting elements of the contacting board with a first group of connection contacts of the components by movement of the contacting board supporting unit perpendicular to the rail engagement part when the contacting nest is docked to the test head,
removing the contacting board from the components with the contacting nest docked to the test head,
laterally moving the contacting board supporting device when the contacting nest is docked to the test head, until the contacting elements of the contacting board are located opposite a second group of connection contacts of the components,
to perform a second test, contacting of the contacting elements of the contacting board with the second group of connection contacts by moving the contacting board supporting unit perpendicular to the rail engagement part when the contacting nest is docked to the test head, and
removing the contacting board from the components.

2. A test apparatus for the testing of electronic components which are present in an assembly, comprising:

a test head, a contacting board held at the test head, having a plurality of contacting elements in the form of contacting pins or contacting springs, a contacting nest for the accommodation of the components to be tested, in which the contacting nest can be docked to the test head and the components have connection contacts which can be brought into contact with the contacting elements of the contacting board, wherein the test head has a contacting board supporting device holding the contacting board, said contacting board supporting device being designed in the form of a slide and being capable of being moved on at least one guide rail of the test head parallel to the plane of the contacting board, wherein the test head has a motorized slide drive, with which the contacting board supporting device, when the contacting nest is docked to the test head, can be moved from a first test position, in which the contacting elements of the contacting board are located opposite a first group of connection contacts of the components to be tested, into a second test position, in which the contacting elements of the contacting board are located opposite a second group of connection contacts of the components to be tested.

3. The test apparatus as claimed in claim 2, wherein the contacting board can be moved perpendicular to the plane of the contacting board, so that it can be moved to the components and away from them when the contacting nest is docked to the test head.

4. The test apparatus as claimed in claim 2, wherein the slide drive has a drawing band which is guided via deflection rollers and is secured to the contacting board supporting device.

5. The test apparatus as claimed in claim 2, wherein the contacting board supporting device has a rail engagement part guided so as to move on at least one guide rail of the test head bracket and a contacting board supporting part which is held on the rail engagement part so as to move relative to the rail engagement part and perpendicular to the plane of the contacting board, and wherein a lifting mechanism is provided, with which the contacting board supporting part together with the contacting board, when the contacting nest is docked, can be removed from the components and can be brought close to them.

6. The test apparatus as claimed in claim 5, wherein the lifting mechanism comprises levers with rams, which can be moved by a pivoting movement of the levers in the lifting direction and move the contacting board supporting part in the contacting direction.

7. The test apparatus as claimed in claim 5, wherein a withdrawal device in the form of springs is provided between the rail engagement part and the contacting board supporting part, in order to move the contacting board supporting part against the contacting device into a withdrawn position.

* * * * *